United States Patent
Benas-Sayag et al.

(10) Patent No.: US 7,573,050 B2
(45) Date of Patent: Aug. 11, 2009

(54) COLUMN SIMULTANEOUSLY FOCUSING A PARTICLE BEAM AND AN OPTICAL BEAM

(75) Inventors: Gérard Benas-Sayag, Saint Orens (FR); Patrick Bouchet, Ceueron (FR); Antoine Corbin, Aix-en-Provence (FR); Pierre Sudraud, Puyloubier (FR)

(73) Assignee: DCG Systems, Inc., Fremont, CA (US)

( * ) Notice: Subject to any disclaimer, the term of this patent is extended or adjusted under 35 U.S.C. 154(b) by 0 days.

(21) Appl. No.: 11/930,734

(22) Filed: Oct. 31, 2007

(65) Prior Publication Data

US 2008/0111084 A1 May 15, 2008

Related U.S. Application Data

(60) Division of application No. 11/295,801, filed on Dec. 6, 2005, now Pat. No. 7,297,948, which is a continuation of application No. 10/239,293, filed as application No. PCT/FR01/00812 on Mar. 19, 2001, now Pat. No. 7,045,791.

(30) Foreign Application Priority Data

Mar. 20, 2000 (FR) .................................. 00 03501

(51) Int. Cl.
H01J 37/305 (2006.01)
(52) U.S. Cl. .............................. 250/492.2; 250/396 R; 250/423 R
(58) Field of Classification Search ............ 250/396 R, 250/309, 310, 492.2, 251; 430/30, 708, 662
See application file for complete search history.

(56) References Cited

U.S. PATENT DOCUMENTS 3,845,305 A * 10/1974 Liebl ........................ 250/309
4,990,776 A * 2/1991 Fushimi et al. ............. 250/310
5,055,696 A * 10/1991 Haraichi et al. .......... 250/492.2
7,439,168 B2 * 10/2008 Boit et al. ................... 438/598
2006/0076489 A1* 4/2006 Ohshima et al. ............ 250/310
2006/0076503 A1* 4/2006 Tsao ...................... 250/396 R
2006/0079086 A1* 4/2006 Boit et al. ................... 438/662
2006/0188797 A1* 8/2006 Roy et al. ..................... 430/30
2006/0226359 A1* 10/2006 Principe ..................... 250/310
2007/0293052 A1* 12/2007 Le Roy et al. ............... 438/708
2008/0185509 A1* 8/2008 Knowles ..................... 250/251

\* cited by examiner

*Primary Examiner*—Nikita Wells
*Assistant Examiner*—Johnnie L Smith
(74) *Attorney, Agent, or Firm*—Nixon Peabody LLP; Joseph Bach, Esq.

(57) ABSTRACT

Column for simultaneously producing a focused particle beam and a focused light beam and method for treating a sample using the column. The column has lateral walls, an input electrode having a particle aperture for emitting a particle beam, an electrostatic lens, an optical focusing device within the lens, and a deflection optical mirror. The method comprises locating the sample below the column, passing the particle beam through entry aperture and exit aperture of the lens to be focused on a selected location on the sample, and injecting an optical beam into the lens through the entry aperture. The lens incorporates convex and concave optical mirrors. The optical beam is injected into the lens to reflect from the convex optical mirror towards the concave optical mirror and then reflect from the concave optical mirror to exit from the exit aperture to be focused on the selected location on the sample.

19 Claims, 2 Drawing Sheets

COLUMN SIMULTANEOUSLY FOCUSING A PARTICLE BEAM AND AN OPTICAL BEAM

CROSS REFERENCE TO RELATED APPLICATIONS

This application is a divisional of U.S. application Ser. No. 11/295,801 filed on Dec. 6, 2005 now U.S. Pat. No. 7,297,948 which is a continuation of and claims priority to U.S. application Ser. No. 10/239,293 filed on Jan. 13, 2003 now U.S. Pat. No. 7,045,791 entitled "Column Simultaneously Focusing a Particle Beam and an Optical Beam," which application is the Section 371 (c) filing of International Application No. PCT/FR01/00812 with an international filing date of Mar. 19, 2001 entitled "Column Simultaneously Focusing a Particle Beam and an Optical Beam," which claims priority to French application No. 00/03501, filed Mar. 20, 2000 entitled "Column Simultaneously Focusing a Particle Beam and an Optical Beam," all of which are incorporated by reference as if fully described herein.

FIELD OF THE INVENTION

This invention relates to an optical column for simultaneously focusing an ion beam and a photon beam onto the same region.

The invention is particularly useful in the field of analysis and repair and manufacture of integrated circuits.

BACKGROUND

Focused ion beams such as ion or electron beams are currently widely used for various types of integrated circuit analysis and manufacturing operations, notably characterization, identification, design and failure analysis, depassivation, vapor phase deposition, micro-machining, etc. These operations are performed using a particle beam production column designed to be focused onto the integrated circuit at the place intended for the desired intervention.

Such a column typically comprises a source of ions such as Ga+ produced from liquid metal which, after extraction, form an ion beam, which is then manipulated by a focusing device comprising a certain number of electrodes operating at determined potentials so as to form an electrostatic lens system adapted to focus the ion beam onto the integrated circuit. Each electrode of the focusing device, notably the output electrode, consists of a series of metallic electrodes having an aperture for passage of the particle beam. It should be noted here that the shape of the various electrodes as well as the aperture diameter plays a determining part in aberrations, notably spherical and chromatic aberration, of the particle focusing device.

One of the limits of applying focused ion beams is the impossibility of employing them to provide an in-depth image of a solid. Only surface images can be obtained. In the case of passivated and planarized integrated circuits, a surface image gives no information on the underlying layers and circuits, which has the disadvantage of making any intervention in the depth of the circuit extremely difficult such as, in particular, the cutting or breaking of buried metal tracks made necessary by design and failure analysis. To overcome this disadvantage, we employ an auxiliary light (photon) beam simultaneously and coaxially focused with the particle beam. In effect, using the light beam to obtain images in the thickness of the circuits, it is possible to visualize layers and tracks in depth and explore them, in real time, using the ion beam. It will now be understood that associating two types of beam, an ion and a photon beam, allows the operator to bring the ion beam exactly to the desired point on the object by means of the image supplied by the light beam.

Certain ion beam production columns also include an optical focusing device, a Cassegrain-Schwartzfeld (C-S) mirror objective lens for example, terminating at an outlet aperture placed close to the surface of a sample subjected to the ion beam.

French patent 2,437,695 discloses an emission ion lens associated with a C-S type mirror objective lens. In this system, the ionic lens part, the elements of which consist of two perforated electrodes and of the sample itself, is located between the object and the mirror objective lens. In this configuration, the apertures in the ion focusing device electrodes must simultaneously be sufficiently large to provide a geometrical expanse for the optical beam allowing sufficient sample illumination, and, relatively small so as not to deteriorate ion beam quality through excessive aberrations. The final diameter chosen for the outlet aperture is consequently a trade-off which is not satisfactory either for the optical beam extent or for ion beam focusing.

Secondly, the system disclosed in French patent 2,437,695 necessitates a very small (a few millimeters) working distance and the submitting of the sample to an electrical field. These two constraints are unacceptable in focused ion beam technology applied to integrated circuits: the danger of destroying the circuits by micro-electrostatic breakdown, impossibility of slanting the sample, difficulty in collecting secondary electrons, and the practical impossibility, through lack of space, of associating the system with a capillary tube for injecting pre-cursor gas which is an essential accessory in focused ion beam technology.

SUMMARY

Thus, the technical problem to be resolved by the subject matter of this invention is to provide a focused particle beam production column comprising:

a device for focusing said particles carrying an output electrode having an outlet aperture for the passage of said particle beam, an optical focusing device for simultaneously focusing a light beam, carrying an outlet opening, such column making it possible to associate:

a comfortable working distance of the order of 15 to 20 mm;

a final ionic lens having chromatic and spherical aberration coefficients of the order of magnitude of aberration coefficients encountered in conventional ionic lenses;

a sufficient numerical aperture for the mirror optics, of the order of 0.3; and zero electric field on the object.

The solution to the technical problem posed consists, according to this invention, in that the outlet opening is transparent to said light beam, said output electrode being formed by a metal insert held in said opening and carrying a central aperture forming said outlet aperture.

Thus, the column of the invention introduces independence between outlet aperture diameter of the particle focusing device and outlet aperture diameter of the optical focusing device. It is thus possible to adjust central aperture diameter of the metal insert to an optimum value for reducing output electrode aberrations, without this in any way prejudicing optical beam numerical aperture, the latter being determined by the diameter of the aperture transparent to the optical beam.

According to one embodiment of the invention, provision is made for the particle focusing device, with said particle focusing device including an intermediate electrode, for the metal insert to project from the opening towards the intermediate electrode. In this way, if electrical breakdown were to accidentally occur between the output electrode and the intermediate electrode, this has maximum probability of occurring at the metal insert, thereby protecting the means for supporting said metal insert, notably the surface treatment of a transparent window of the outlet aperture.

The particle production column of the invention is suited to a great number of applications including:

treatment of a sample with a charged particle beam using information supplied by the optical beam and, in particular, precise investigation of the effects of a particle beam on an integrated circuit by means of information supplied by the optical beam, treatment of a sample requiring use of a laser focused onto said sample and, in particular, removal of integrated circuit layers by laser with or without chemical assistance, allowing etching or milling at a finer and more local scale, assisted deposition, or electron or ion beam analysis, integration of electron or ion beams with infra-red microscopy for integrated circuit analysis, laser chemical etching allowing milling of integrated circuits by ionic beam or electron beam probing, display of optical transitions created, for example, by the effect of ion beams or other light phenomena appearing on a sample, laser marking of integrated circuits, electron beam probing of diffusion in integrated circuits or other samples, canceling of the effects of static charges by UV photons when performing focused electron or ion treatment, spectroscopic micro-analysis of photons emitted under particle impact.

The description that follows with reference to the attached drawings, provided by way of non-limiting example, will lead to a better understanding of the invention and how it may be carried out.

DETAILED DESCRIPTION OF EMBODIMENTS OF THE INVENTION

Figure 1:
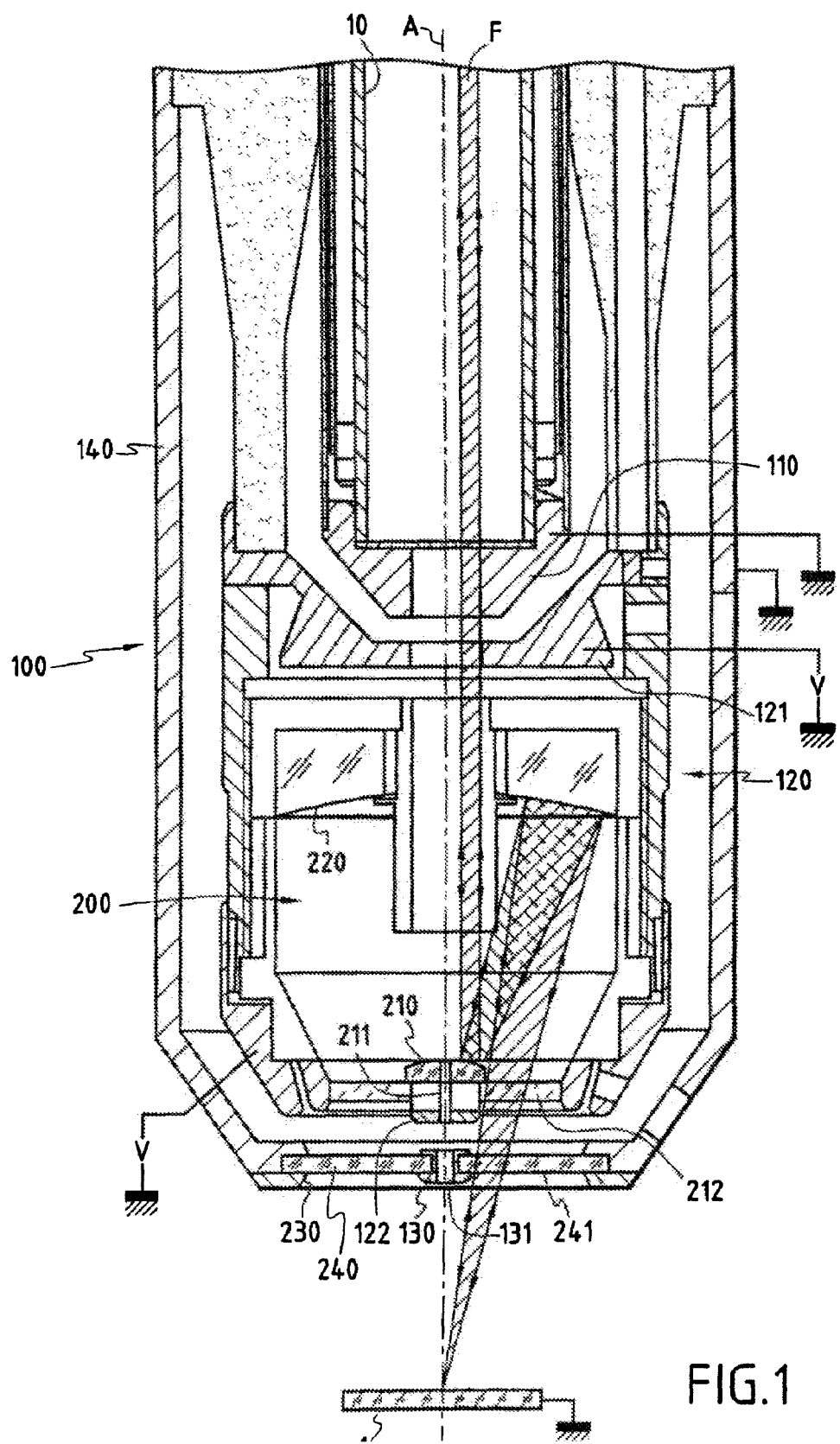
FIG. 1 is a partial side view in section of a particle beam production column according to one first embodiment of the invention.

In FIG. 1, we have partially shown, in section, a particle beam production column for focusing onto an integrated circuit 1. The particle beam axis which coincides with the column axis is identified by reference letter A. Although the column in FIG. 1 applies to all sorts of charged particles, electrons or ions, we shall take below the example of an ion beam.

Only the downstream part of the column is shown in FIG. 1, the ion source and the means for extracting and conditioning the ion beam which are known per se, not being shown.

The part of the column shown in FIG. 1 essentially comprises a device 100 for focusing the ion beam onto integrated circuit 1. This device 100 carries three electrodes, specifically an input electrode 110 which is grounded, an intermediate electrode 120 brought to a nonzero potential V which may be positive or negative for example of 20 Kev, and an output electrode 130 also grounded. These electrodes 110, 120, 130 are contained between lateral walls 140 of the column, the latter being grounded.

In fact, on FIG. 1 it can be seen that intermediate electrode 120 is a complex two-part electrode made up by a first intermediate electrode 121 arranged close to input electrode 110 and by a second intermediate electrode 122 arranged close to output electrode 130. These electrodes together form an electrostatic lens of the thick, geometrically asymmetric but electrically symmetric type.

It can be seen on FIG. 1 that an optical focusing device 200 designed to focus an optical beam F simultaneously and coaxially with the particle beam on axis A is located between the two intermediate electrodes 121, 122. This device 200 allows both optical beam F to be focused onto sample 1 thereby forming an enlarged image of the sample as well as collection of light radiation emitted by said sample or by sputtered atoms following ionic bombardment. Optical beam F is obtained from a non-illustrated light source generally arranged laterally with respect to the column with the light being re-directed parallel to axis A and by a mirror at 45.degree. located on said axis and including an aperture for passage of the ion beam.

In the embodiment of FIG. 1, optical focusing device 200 is a Cassegrain-type mirror objective lens comprising a first convex spherical mirror 210 located in optical beam path F and a second concave spherical mirror 220 focusing onto integrated circuit 1 the beam coming from first mirror 210. The latter includes an aperture 211 for allowing the ion beam to pass through the second intermediate electrode 122, the assembly formed by the first mirror 210 and said second intermediate electrode 122 being held at the centre of the column by a metal tripod 212 providing a high degree of transparency to the light beam.

As can be seen in FIG. 1, optical focusing device 200 also carries an outlet aperture 230 itself including a window 240 that is transparent to photons of optical beam F, held by its edges to the outer housing of the grounded column. Output electrode 130 is formed by a metal insert passing through a window 240, and which is retained by said window 240 and including a central aperture at its middle 131 for the output of electrode 130. In order to ground said output electrode 130, transparent window 240 is electrically conducting. In particular, it can be glass-plated covered with at least one conducting layer 241 such as indium and/or tin oxide. It is thus possible to select a small diameter outlet for aperture 131, compatible with the resolution desired for the ion beam, while maintaining, in an independent fashion, a larger diameter opening 230, providing a geometrical expanse for the optical beam ensuring sufficient-numerical aperture and thereby obtaining a high quality optical image of the sample 1 observed. Clearly, outlet window 240 could just as well be made of any bulk material transparent to photons, and electrically conducting.

In FIG. 1 it can be seen that metal insert 130 projects from the surface of window 240 towards second intermediate electrode 122, thereby protecting said window in the case of electrical breakdown, the latter occurring between insert 130 and the second electrode 122.

Figure 2:
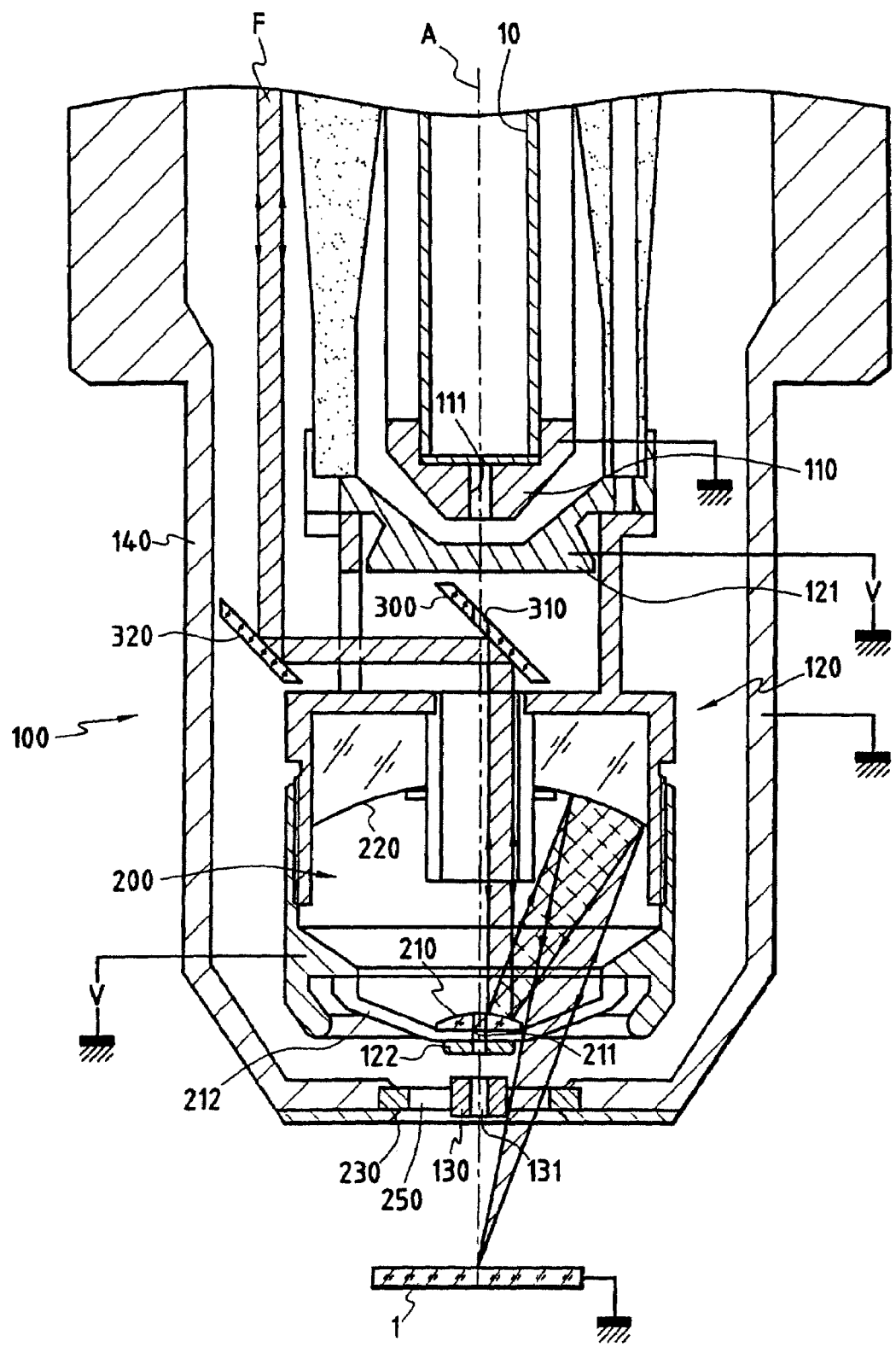
FIG. 2 is a partial side view in section of a particle beam production column according to a second embodiment of the invention.

Like the embodiment shown in FIG. 1, optical focusing device 200 of the embodiment of the invention shown in FIG. 2 is a Cassegrain-type objective lens with mirrors 210, 220 brought to a high-voltage comprised, for example, between 10 and 20 keV.

However, a first mirror 300 is located on ion beam axis A between the first intermediate electrode 121 and the second intermediate electrode 122 and, more precisely, between first intermediate electrode 121 and the Cassegrain-type objective lens with mirrors 210, 220. This mirror 300 carries an aperture 310 for passage of the ion beam. It is inclined substantially at 45.degree. with respect to axis A in order to deflect optical beam F through about 90.degree. laterally towards a second mirror 320 arranged in the space comprised between the lateral walls 140 of the column and part 120. This second mirror 320 is itself angled at 45.degree. with respect to axis A. It deflects beam F through 90 degrees in the same direction as axis A, parallel to the latter.

Thus, the diameter of aperture 111 provided at the extremity of input electrode 110, designed to allow passage of ion beam A but the function of which is not, contrary to the embodiment of FIG. 1, to allow passage of the optical beam, can be reduced to values of millimetric scale order. Further, deflector plates 10 located upstream of input electrode 110 no longer require the anti-reflection treatment needed for good conduction of the optical beam. Finally, artefacts due to the light beam interacting with the walls of the ionic optical elements which did exist upstream of first mirror 300, in particular at deflector plates 10 of the embodiment in FIG. 1 and which notably decrease quality of interpretation of the images obtained, are eliminated.

Further, in the embodiment of FIG. 2, aperture 230 does not carry a window 240 but rather a set of metallic or, at the least electrically-conducting, tabs or legs. There are for example three such tabs forming a metallic tripod 250 which is retained by the edges of the outer housing of the grounded column, delimiting aperture 230. They ensure good retention of insert 150 while ensuring aperture 230 is kept transparent for the optical beam. Thus, like in the embodiment of FIG. 1, it is possible to choose, for output aperture 131, a small value of diameter compatible with the resolution required for the ionic beam, while maintaining, completely independently, a larger diameter aperture 230 offering the light beam a geometrical expanse allowing sufficient illumination of the observed sample 1.

Finally, in the embodiment of FIG. 2, the tabs or legs of metal tripod 212 designed to hold the unit formed by mirror 210 and the second intermediate electrode 122 are curved so as to increase their spacing from the legs of tripod 250 and output electrode 130. Thanks to this, risks of spark-over are limited as are distortions of the electrical field due to the tripod.

What is claimed is:

1. A method for treating a sample by means using a column combining charged particle beam and an optical beam, comprising:
providing a column having an electrostatic lens comprising an entry aperture at a top section and an exit aperture at a bottom section, the electrostatic lens incorporating a convex optical mirror and a concave optical mirror;
locating a sample below the column;
passing a particle beam through the entry aperture and exit aperture of the electrostatic lens so as to be focused on a selected location on the sample;
injecting an optical beam into the electrostatic lens through the entry aperture, so as to reflect from the convex optical mirror towards the concave optical mirror and then reflect from the concave optical mirror to exit from the exit aperture so as to be focused on the selected location on the sample.

2. The method of claim 1, wherein injecting optical beam comprises injecting one of a UV light, an infra-red light and a laser beam.

3. The method of claim 1, further comprising investigating the effect of the particle beam on the sample by information supplied by the optical beam.

4. The method of claim 1, wherein the treating comprises one of etching, engraving, and assisted deposition.

5. The method of claim 4, wherein the treating further comprises providing chemical assistance.

6. The method of claim 1, further comprising passing the optical beam through a conductive transparent window after the optical beam has passed the exit aperture.

7. The method of claim 6, further comprising passing the particle beam through a metallic inset situated at the center of the transparent window.

8. The method of claim 1, wherein injecting an optical beam into the electrostatic lens through the entry aperture comprises injecting the optical beam coaxially to the particle beam.

9. A column for simultaneously producing a focused particle beam and a focused light beam, the column comprising:
lateral walls;
an input electrode situated within the lateral walls and having a particle aperture for emitting a particle beam;
an electrostatic lens situated within the lateral walls and positioned to receive the particle beam from the particle aperture of the input electrode;
an optical focusing device positioned within the electrostatic lens, the optical focusing device having a convex mirror and a concave mirror, the convex mirror having a through-hole at the center thereof allowing passage of the particle beam there-through, the convex mirror facing the concave mirror;
a deflection optical mirror situated between the input electrode and the concave mirror and having an aperture for passage of the particle beam, the deflection mirror positioned to deflect optical beam towards the convex mirror through the through-hole of the concave mirror.

10. The column of claim 9, further comprising an optically transparent window for transmitting the light beam after the light beam reflects from the concave mirror.

11. The column of claim 10, further comprising an output electrode is centrally located within the transparent window.

12. The column of claim 11, wherein the transparent window is electrically conductive.

13. The column of claim 12, wherein the output electrode and the transparent window are coupled to the same electrical potential.

14. The column of claim 13, wherein the electrical potential is ground reference.

15. The column of claim 11, wherein the output electrode comprises a metallic insert projecting from the surface of the transparent window.

16. The column of claim 11, wherein the transparent window comprises a layer of indium tin oxide.

17. The column of claim 9, further comprising a particle beam output aperture and a coaxially positioned optical beam output aperture.

18. The column of claim 17, wherein the diameter of the particle beam output aperture differs from the diameter of the optical beam output aperture.

19. The column of claim 18, wherein the optical beam aperture comprises a bulk material transparent to photons and the particle beam aperture comprises a through-hole in the bulk material.

* * * * *